(12) United States Patent
Liu et al.

(10) Patent No.: US 9,158,162 B2
(45) Date of Patent: Oct. 13, 2015

(54) ARRAY SUBSTRATE STRUCTURE AND DISPLAY PANEL AND MANUFACTURING METHOD THEREOF

(71) Applicant: Innolux Corporation, Miao-Li County (TW)

(72) Inventors: Yu-Tsung Liu, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 213 days.

(21) Appl. No.: 13/845,172

(22) Filed: Mar. 18, 2013

(65) Prior Publication Data
US 2013/0258265 A1    Oct. 3, 2013

(30) Foreign Application Priority Data
Mar. 30, 2012   (TW) .............................. 101111305 A

(51) Int. Cl.
*G02F 1/1333* (2006.01)
*G02F 1/1343* (2006.01)
*H01L 23/535* (2006.01)
*H01L 21/768* (2006.01)
*G02F 1/1362* (2006.01)

(52) U.S. Cl.
CPC .... *G02F 1/134309* (2013.01); *G02F 1/133345* (2013.01); *G02F 1/134363* (2013.01); *H01L 21/76879* (2013.01); *H01L 23/535* (2013.01); *G02F 1/136227* (2013.01)

(58) Field of Classification Search
CPC ..................... G02F 1/133345; G02F 1/136227
USPC .......................................................... 349/138
See application file for complete search history.

(56) References Cited

U.S. PATENT DOCUMENTS

| 5,943,105 | A | 8/1999 | Fujikawa et al. | |
|---|---|---|---|---|
| 6,630,977 | B1 | 10/2003 | Yamazaki et al. | |
| 8,395,717 | B2 | 3/2013 | Nakamura et al. | |
| 2004/0125325 | A1* | 7/2004 | Murai et al. | 349/187 |
| 2010/0227425 | A1 | 9/2010 | Tanabe et al. | |
| 2010/0289000 | A1* | 11/2010 | Kojima | 257/13 |
| 2011/0228189 | A1* | 9/2011 | Oh et al. | 349/43 |
| 2012/0105778 | A1* | 5/2012 | Fujiyoshi et al. | 349/106 |
| 2012/0327347 | A1* | 12/2012 | Cho et al. | 349/138 |

FOREIGN PATENT DOCUMENTS

CN   102289118 A   12/2011

OTHER PUBLICATIONS

SIPO Office Action dated Apr. 20, 2015 in corresponding Chinese application (No. 201210090279.8).
TIPO Office Action dated Mar. 3, 2015 in corresponding Taiwan application (No. 101111305).

* cited by examiner

*Primary Examiner* — Phu Vu
(74) *Attorney, Agent, or Firm* — McClure, Qualey & Rodack, LLP

(57) ABSTRACT

An array substrate structure including a first substrate, a plurality of thin film transistors, a first dielectric layer, a second dielectric layer, and a second electrode layer is provided. Each of the thin film transistors has a patterned first electrode layer which is disposed on the first electrode layer and has a first through hole. The second dielectric layer is disposed on the first dielectric layer and has a second through hole. The second through hole is connected to the first through hole, such that the second electrode layer is electrically connected to the first electrode layer via the first through hole and the second through hole.

18 Claims, 5 Drawing Sheets

ARRAY SUBSTRATE STRUCTURE AND DISPLAY PANEL AND MANUFACTURING METHOD THEREOF

This application claims the benefit of Taiwan application Serial No. 101111305, filed Mar. 30, 2012, the subject matter of which is incorporated herein by reference.

FIELD OF THE INVENTION

The invention relates in general to an array substrate structure and a display panel and a manufacturing method thereof, and more particularly to an array substrate structure including at least two dielectric layers and one electrode layer and a display panel and a manufacturing method thereof.

DESCRIPTION OF THE RELATED ART

The in-plane-switching (IPS) display panel is applied with an electric field horizontally for twisting the liquid crystal molecules in a direction parallel to the substrate, so as to increase the viewing angle and greatly improve the chromatic aberration issue occurred in the twisted nematic (TN) liquid crystal screen.

In order to horizontally apply an electric field to the liquid crystal molecules, the IPS display panel has a horizontal electrode structure electrically connected to the thin film transistors through a contact hole. However, the existing manufacturing process requires too many procedures, and consequently, the conformity rate is low and the overall size cannot be reduced. In the development of the IPS display panel, the research personnel are dedicated to studying and resolving the above problems.

SUMMARY OF THE INVENTION

The invention is directed to an array substrate structure and a display panel and a manufacturing method thereof. A recess is formed by etching a first dielectric material layer and a second dielectric material layer, such that the manufacturing conformity rate is increased, the manufacturing procedures are simplified, and the overall size is reduced.

According to an embodiment of the present invention, an array substrate structure is provided. The array substrate structure includes a first substrate, a plurality of thin film transistors, a first dielectric layer, a second dielectric layer, and a second electrode layer. Each of the thin film transistors has a first electrode layer which is patterned, and the first dielectric layer is disposed on the first electrode layer and has a first through hole. The second dielectric layer is disposed on the first dielectric layer and has a second through hole connected to the first through hole. The first through hole and the second through hole form a recess. The second electrode layer is electrically connected to the first electrode layer via the first through hole and the second through hole.

According to another embodiment of the present invention, a display panel is provided. The display panel includes an array substrate structure, a second substrate, and a liquid crystal layer. The second substrate has a light filtering layer. The array substrate structure includes a first substrate, a plurality of thin film transistors, a first dielectric layer, a second dielectric layer, and a first electrode layer. The thin film transistors are disposed on the first substrate. Each of the thin film transistors has a first electrode which is patterned layer, and the first dielectric layer is disposed on the first electrode layer and has a first through hole. The second dielectric layer is disposed on the first dielectric layer and has a second through hole connected to the first through hole. The first through hole and the second through hole form a recess. The second electrode layer is disposed on the second dielectric layer and a bottom and a side wall of the recess. The second substrate having a light filtering layer disposed thereon is assembled with the array substrate structure. The liquid crystal layer is disposed between the array substrate structure and the second substrate.

According to an alternate embodiment of the present invention, a manufacturing method of an array substrate structure is provided. The manufacturing method of an array substrate structure includes the following steps: A first substrate is provided. A plurality of thin film transistors is formed on the first substrate, wherein a top portion of each of the thin film transistors has a first electrode layer which is patterned. A first dielectric material layer is formed on the first electrode layer. A second dielectric material layer is formed on the first dielectric material layer. A photo-resist layer is provided to the second dielectric material layer. The first dielectric material layer and the second dielectric material layer are etched according to the photo-resist layer as a mask to form a first dielectric layer and a second dielectric layer, wherein the first dielectric layer has a first through hole, the second dielectric layer has a second through hole connected to the first through hole, and the first through hole and the second through hole form a recess. A second electrode layer is formed on the second dielectric layer and is electrically connected to the first electrode layer via the recess formed of the first through hole and the second through hole.

The above and other aspects of the invention will become better understood with regard to the following detailed description of the preferred but non-limiting embodiment(s). The following description is made with reference to the accompanying drawings.

DETAILED DESCRIPTION OF THE INVENTION

An array substrate structure and a display panel and a manufacturing method thereof are disclosed in a number of embodiments below. By etching the first dielectric material layer and the second dielectric material layer to form a recess, the manufacturing conformity rate is increased, the manufacturing procedures are simplified, and the overall size is reduced. However, detailed structures and manufacturing procedures disclosed in the embodiments are for descriptions only, not for limiting the scope of protection of the invention. Anyone who is skilled in the technology of the invention will be able to modify or adjust the procedures to meet actual needs for practical applications. In addition, in the embodiments, some of the elements are omitted to clearly show the technical features of the invention.

Figure 1:
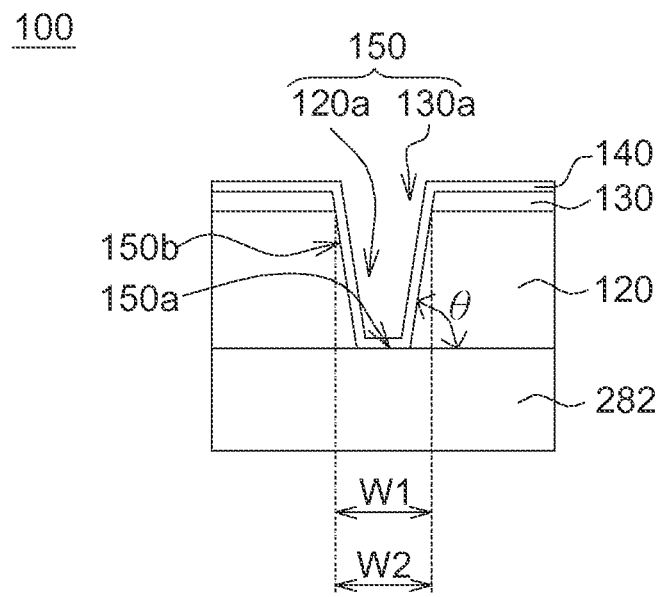
FIG. 1 shows a cross-sectional view of an array substrate structure according to an embodiment of the invention.
Figure 4:
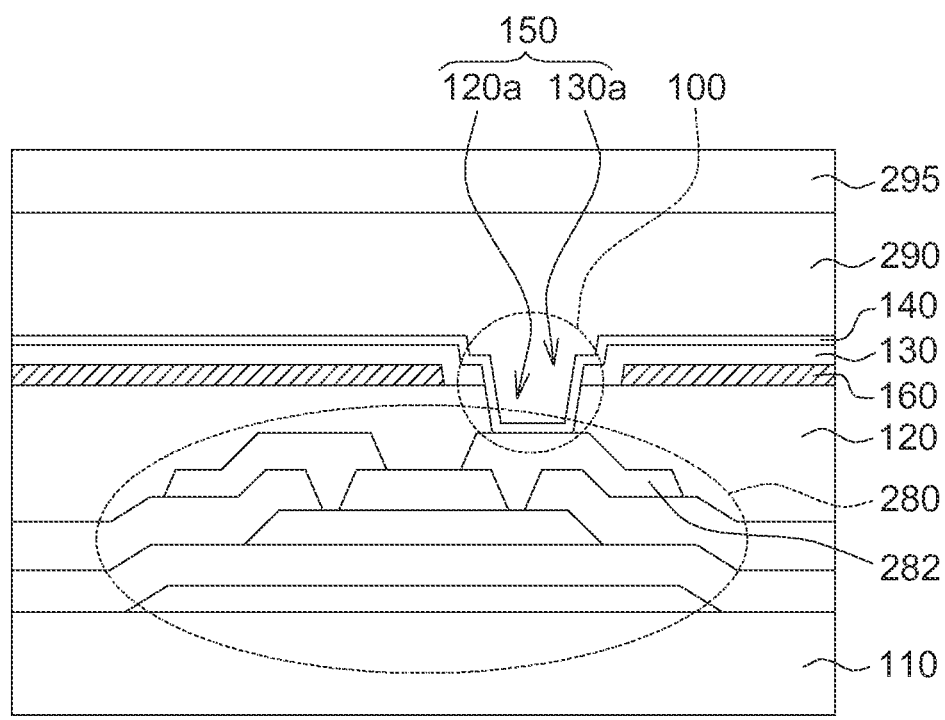
FIG. 4 shows a cross-sectional view of a display panel according to an embodiment of the invention.

Referring to FIG. 1 and FIG. 4. FIG. 1 shows a cross-sectional view of an array substrate structure according to an embodiment of the invention. FIG. 4 shows a cross-sectional view of a display panel according to an embodiment of the invention. The array substrate structure 100 includes a first substrate 110, a plurality of thin film transistors 280, a first dielectric layer 120, a second dielectric layer 130, and a second electrode layer 140. A top portion of each of the thin film transistors 280 has a first electrode layer 282 which is patterned. The first dielectric layer 120 is formed of such as a silicon-containing material, and preferably formed of a photo-sensitive silicon-containing material. The second dielectric layer 130 is formed of such as a photo-sensitive inorganic material. The first dielectric layer 120 is disposed on the first substrate 110 and has a first through hole 120a. The second dielectric layer 130 is disposed on the first dielectric layer 120 and has the second through hole 130a corresponding to the first through hole 102a and connected to the first through hole 120a. The first through hole 120a and the second through hole 130a form a recess 150 continually. The second electrode layer 140 is disposed on the second dielectric layer 130 and a bottom portion 150a and a side wall 150b of the recess 150. The second electrode layer 140 and is electrically connected to the first electrode layer 282 via the first through hole 120a and the second through hole 130a. It is to be noted that the difference between the array substrate structures shown in FIGS. 1 and 4 is in the design of a third electrode layer 160, which will be described in the following embodiments.

As shown in FIG. 1, in the embodiment, a top portion of the first through hole 120a has a first width W1, a bottom portion of the second through hole 130a has a second width W2, and the first width W1 is substantially equal to the second width W2. Thus, the side wall surface of the top portion of the first through hole 120a and the side wall surface of the bottom portion of the second through hole 130a substantially are jointed seamlessly. That is, the side wall 150b of the recess 150 is substantially smooth and free of sectional differences. Conventionally, a recess structure is formed of at least two connecting openings having different widths, which require at least two etching steps in the manufacturing process. Due to the features and restrictions in the manufacturing process of a matrix substrate, performing at least two etching steps to form at least two openings having different widths connected to each other will increase the lateral path of the array substrate structure. Therefore, the recess 150 of the application which is substantially free of sectional differences can effectively reduce the lateral path of the array substrate structure, so that the product using the same is downsized and becomes advantageous to be used in devices requiring high resolution.

In an embodiment, the first dielectric layer 120 is formed of a silicon-containing material, such as a silicon oxide or spin on glass (SOG). The SOG has higher light transmittance compared to conventional acrylic dielectric materials. For example, the light transmittance of glass is such as 99%, but the light transmittance of acrylic dielectric materials is only such as 90%. In an embodiment, the array substrate structure 100 is used in a display panel, the first dielectric layer 120 is formed of a silicon oxide or SOG to increase the light transmittance and accordingly increase the aperture rate. Furthermore, the SOG has a high breakdown voltage providing excellent electro static discharge (ESD) protection to the overall structure or device. In addition, the silicon-containing material has a high dielectric constant, such that conductive structures such as pixel electrodes and data lines can be effectively separated from one another by the first dielectric layer 120, and hence the crosstalk noise is reduced, and the display quality of the display panel is increased. In an embodiment, the first dielectric layer 120 is preferably formed of a photo-sensitive silicon-containing material.

In an embodiment, the second dielectric layer 130 is formed of a photo-sensitive inorganic material, such as a silicon oxide or a silicon nitride. The second dielectric layer 130 is preferably formed of a water-resistant material.

As shown in FIG. 1, an angle θ, preferably less than or equal to 85° and greater than or equal to 50°, is contained between the side wall 150b and the bottom 150a of the recess 150. In the process of coating a film on the side wall 150b and the bottom 150a of the recess 150, due to the angle θ, a continuous and uniform film without cleavage is preferably formed.

In an embodiment, the array substrate structure 100 can further include at least one element or functional film disposed between the first substrate 110 and the first dielectric layer 120, such as the thin film transistors, and the second electrode layer 140 is electrically connected to the thin film transistors via the recess 150.

Figure 2A:
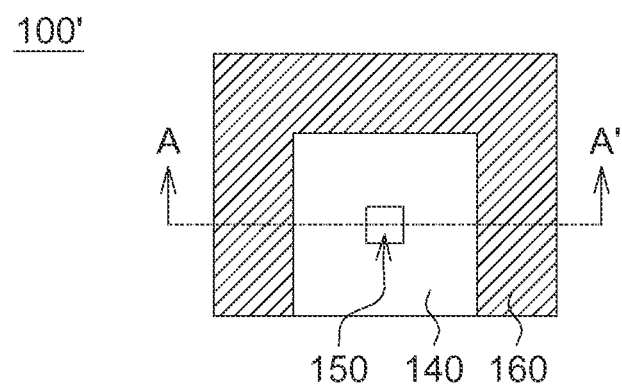
FIG. 2A shows a top view of an array substrate structure according to another embodiment of the invention.
Figure 2B:
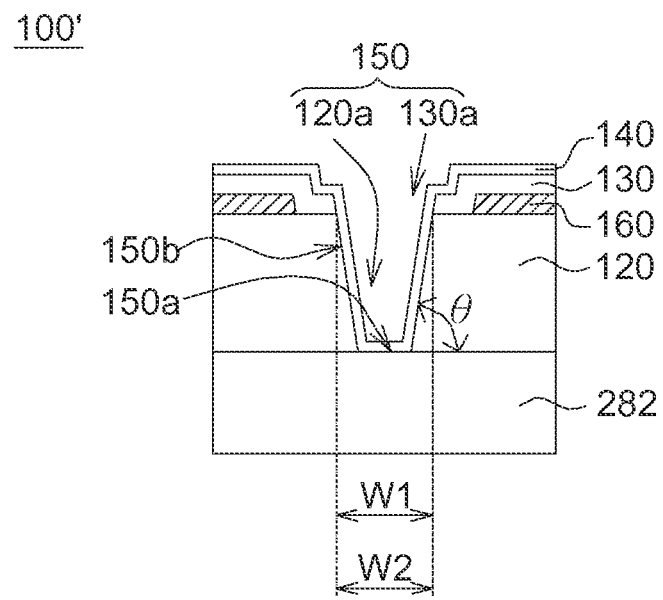
FIG. 2B shows a cross-sectional view of the array substrate structure of FIG. 2A along a cross-sectional line A-A'.

Referring to FIGS. 2A~2B. FIG. 2A shows a top view of an array substrate structure according to another embodiment of the invention. FIG. 2B shows a cross-sectional view of the array substrate structure of FIG. 2A along a cross-sectional line A-A'. It is to be noted that some of the elements of FIG. 2A are shown in a perspective way to show relative positions of the elements. The elements in this and previous embodiments sharing the same labeling are the same elements, and the description of which are as aforementioned.

The array substrate structure 100' includes a first substrate 110, a plurality of thin film transistors 280, a first dielectric layer 120, a second dielectric layer 130, a second electrode layer 140, and a third electrode layer 160. The top portion of each of the thin film transistors 280 has a first electrode layer 282 which is patterned, and the third electrode layer 160 is disposed between the first dielectric layer 120 and the second dielectric layer 130.

In an embodiment, as shown in FIG. 2A, the second electrode layer 140 is disposed on the third electrode layer 160 and covers the third electrode layer 160. The third electrode layer 160 can be such as a patterned electrode, and the third electrode layer 160 is not adjacent to the recess 150.

In an embodiment, as shown in FIG. 2B, the third electrode layer 160 and the side wall 150b of the recess 150 are separated by the second dielectric layer 130 to avoid the second electrode layer 140 contacting the third electrode layer 160 and being short-circuited.

Figure 3:
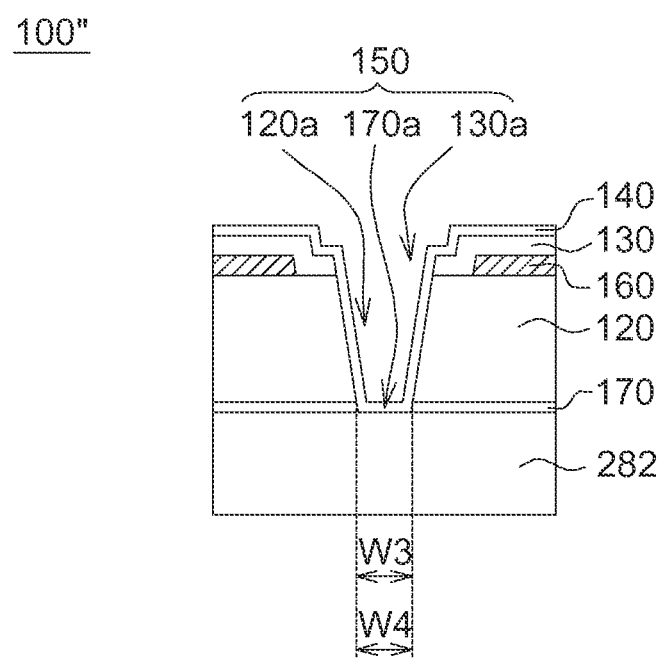
FIG. 3 shows a cross-sectional view of an array substrate structure according to an alternate embodiment of the invention.

Referring to FIG. 3, a cross-sectional view of an array substrate structure according to an alternate embodiment of the invention is shown. The elements in this and previous embodiments sharing the same labeling are the same elements, and the description of which are as aforementioned.

The array substrate structure 100" includes a first substrate 110, a plurality of thin film transistors 280, a first dielectric layer 120, a second dielectric layer 130, a third dielectric layer 170, a second electrode layer 140, and a third electrode layer 160. The top portion of each of the thin film transistors 280 has a first electrode layer 282 which is patterned. The third dielectric layer 170 is disposed between the first dielectric layer 120 and the first substrate 110 and has a third through hole 170a preferably formed of a photo-sensitive material.

In an embodiment, as shown in FIG. 3, the third through hole 170a is connected to the first through hole 120a, and the first through hole 120a, the second through hole 130a, and the third through hole 170a form a recess 150. In the embodiment, the top portion of the third through hole 170a has a third width W3, the bottom portion of the first through hole 120a has a fourth width W4, and the third width W3 is substantially equal to the fourth width W4. Thus, the side wall surface of the bottom portion of the first through hole 120a and the side wall surface of the top portion of the third through hole 170a substantially are jointed seamlessly. That is, the side wall 150b of the recess 150 is substantially smooth and free of sectional differences. Conventionally, a recess structure is formed of at least three connecting openings having different widths, which require at least three etching steps in the manufacturing process. Due to the features and restriction in the manufacturing process of a matrix substrate, performing at least three etching steps to form at least three openings connected to one another having different widths will increase the lateral path of the array substrate structure.

Therefore, the recess 150 of the application which is substantially free of sectional differences can effectively reduce the lateral path of the array substrate structure, such that the product using the same is downsized and becomes advantageous to be used in devices requiring high resolution. In the embodiment, the third dielectric layer 170 is formed of such as a water-resistant material. In an embodiment, the array substrate structure 100" is used in a display panel and particularly in an organic light emitting diode (OLED) display device. When components disposed inside the display device, such as the organic light emitting diode, is in contact with water vapor, most of the components will be easily damaged. The third dielectric layer 170 formed of a water-resistant material effectively prevents the water vapor from entering the display device and avoids the water vapor damaging the internal components or affecting the display quality, hence increasing the durability of the display device. The display device using the matrix substrate 100" of the present embodiment can be such as an active-matrix organic light emitting diode (AMOLED) display panel. However, the array substrate structure 100" can also be used in other types of display panels.

Referring to FIG. 4. The elements in this and previous embodiments sharing the same labeling are the same elements, and the description of which are as aforementioned.

The display panel 200 includes an array substrate structure 100, a second substrate 295 having a light filtering layer, and a liquid crystal layer 290. The array substrate structure 100 includes a first substrate 110, a plurality of thin film transistors 280, a first dielectric layer 120, a second dielectric layer 130, and a second electrode layer 140. The top portion of each of the thin film transistors 280 has a first electrode layer 282 which is patterned, and the thin film transistors 280 are disposed on the first substrate 110. The first dielectric layer 120 is disposed on the first substrate 110 and has a first through hole 120a. The second dielectric layer 130 is disposed on the first dielectric layer 120 and has a second through hole 130a connected to the first through hole 120a. The first through hole 120a and the second through hole 130a form a recess 150. The second electrode layer 140 is disposed on the second dielectric layer 130 and a bottom 150a and a side wall 150b of the recess 150. The second substrate 295 is disposed on the array substrate structure 100. The liquid crystal layer 290 is disposed between the array substrate structure 100 and the second substrate 295.

In an embodiment, the first electrode layer 282 which is patterned is located on the top portions of the thin film transistors 280, and the second electrode layer 140 is electrically connected to the first electrode layer 282 of the thin film transistors 280 via the recess 150. The display panel 200 of the present embodiment can be an IPS display panel, and the array substrate structure 100 can be a horizontal electrode structure. However, the display panel 200 and the array substrate structure 100 can also be other types of display devices and array substrate structures.

In an embodiment, the second substrate 295 is a film component adjacent to the display surface of the display panel, and the light filtering layer may have a color filter, a black matrix, and a polarizer disposed outside the second substrate. However, the second substrate 295 can also be other types of film components. The second substrate 295 is a component generally known to anyone who is skilled in the technology of the invention and is not repeated here.

A manufacturing method of an array substrate structure of an embodiment is disclosed below. However, the procedures of the method are for detailed descriptions only, not for limiting the scope of protection of the invention. Anyone who is skilled in the technology of the invention will be able to modify or adjust the procedures to meet actual needs in practical applications. Referring to FIGS. 5A~5E, procedures of manufacturing an array substrate structure according to an embodiment of the invention are shown.

Figure 5A:
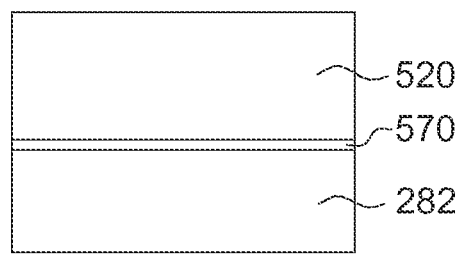
FIGS. 5~5E show procedures of manufacturing an array substrate structure according to an embodiment of the invention.

Referring to FIG. 5A. A first substrate 110 is provided, and a plurality of thin film transistors 280 is formed on the first substrate 110. A first electrode layer 282 which is patterned is formed on the top portions of the thin film transistors 280, and a first dielectric material layer 520 is formed on the first electrode layer 282. In the embodiment, the first dielectric material layer 520 is formed of such as SOG. By controlling the viscosity coefficient, coating thickness, and spin coating speed of the sol gel of the SOG, as shown in FIG. 5A, the first dielectric material layer 520 may be formed with a substantially flat surface. When the viscosity coefficient is too low, the coating may be too thin and the surface flatness of the first dielectric material layer 520 may deteriorate. In an embodiment, the first dielectric material layer 520 is preferably formed of a photo-resist material, which is advantageous to subsequent etching process, such as yellow light etching process.

In an embodiment, after the first substrate 110 is provided, a third dielectric material layer 570 can be optionally formed on the first electrode layer 282, and a first dielectric material layer 520 is formed on the third dielectric material layer 570. In an embodiment, the third dielectric material layer 570 is formed of a photo-sensitive material. In an embodiment, the third dielectric material layer 570 is preferably formed of a water-resistant material.

Figure 5B:
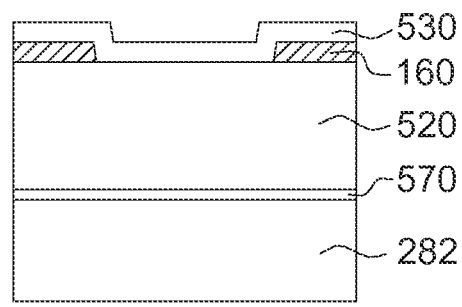

Referring to FIG. 5B, a second dielectric material layer 530 is formed on the first dielectric material layer 520. In an embodiment, the second dielectric material layer 530 is formed of a photo-sensitive inorganic material, such as a silicon oxide or a silicon nitride. The second dielectric material layer 530 is preferably formed of a water-resistant material.

As shown in FIG. 5B, in the embodiment, after the first dielectric material layer 520 is formed on the first electrode layer 282, the third electrode layer 160 may be optionally formed on the first dielectric material layer 520, and then a second dielectric material layer 530 is formed on the third electrode layer 160.

Figure 5C:
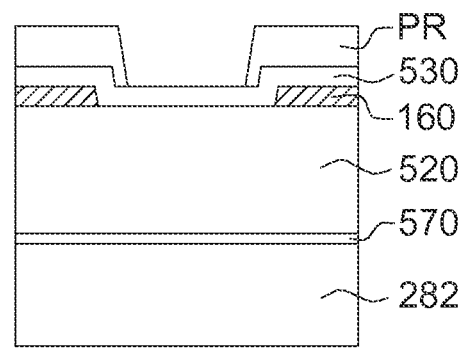
Figure 5D:
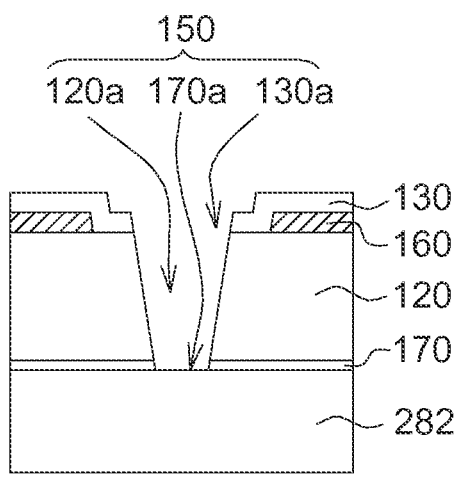

Referring to FIG. 5C-5D. A photo-resist layer PR is provided on the second dielectric material layer 530. Next, the first dielectric material layer 520 and the second dielectric material layer 530 are etched according to the photo-resist layer PR as a mask to form a first dielectric layer 120 and a second dielectric layer 130. In an embodiment, the steps of etching the first dielectric material layer 520 and etching the second dielectric material layer 530 are performed by a wet etching process, in which the first dielectric material layer 520 and the second dielectric material layer 530 are etched with an etching solution.

In an embodiment, as shown in FIG. 5D, after the photo-resist layer PR is removed, the first dielectric layer 120 has a first through hole 120a, and the second dielectric layer 130 has a second through hole 130a at a location corresponding to the fist through hole and connected to the first through hole 120a, and the first through hole 120a and the second through hole 130a form a recess 150. In an embodiment, the steps of etching the first dielectric material layer 520 and etching the second dielectric material layer 530 are completed at the same time. Furthermore, the step of etching the first dielectric material layer 520 and the step of etching the second dielectric material layer 530 are completed at the same time by a wet etching process, in which the first dielectric material layer 520 and the second dielectric material layer 530 are etched with an etching solution. As such, the recess 150 can be directly formed by etching the first dielectric material layer 520 and the second dielectric material layer 530 at the same time without using any additional photo-resist layers for additional etching steps, such that the manufacturing procedures are further simplified. However, if etching the first dielectric material layer 520 and etching the second dielectric material layer 530 are performed in different steps, the second photo-resist layer in the second etching step will have to be coated in the opening formed in the first etching step as well as outside the opening, and hence the thickness of the second photo-resist layer in the opening would be larger than the thickness of the second photo-resist layer outside the opening. As such, when the lithographic exposure process is performed, higher exposure energy is required for the photo-resist layer in the opening, which may increse the problem of lowering the conformity rate. In this disclosure, the first dielectric material layer 520 and the second dielectric material layer 530 with flat surfaces and relatively small overall thickness (no opening needs to be filled) are etched in the same step to form the recess 150, such that the adjustment of energy for the lithographic exposure process is not necessary, and the manufacturing conformity rate can be effectively increased.

In an embodiment, the first dielectric material layer 520 and the second dielectric material layer 530 may be formed of inorganic photo-resist materials substantially having the same etching rate to form a recess 150 in one etching step, wherein the side wall 150b of the recess 150 is substantially smooth and free of sectional differences. In an embodiment, the first dielectric material layer 520 and the second dielectric material layer 530 which have the same etching rate are etched at the same time to form the recess 150 in one etching step without using any additional photo-resist layers for additional etching steps. Also, a recess structure of at least two connecting openings having different widths resulted from at least two etching steps will not be formed. Thus, the manufacturing procedures are simplified, the extension in the lateral path of the array substrate structure resulted from the at least two connecting openings having different widths is reduced, the lateral path of the array substrate structure is effectively reduced, such that the product using such array substrate structure is downsized, and it is advantageous for the array substrate structure to be used in devices requiring high resolution.

In an embodiment, the etching step is performed by such as a wet etching process. The etching selection ratio of the etching solution with respect to the first dielectric material layer 520 and the second dielectric material layer 530 is substantially 1. That is, the etching rates of the first dielectric material layer 520 and the second dielectric material layer 530 with respect to the etching solution are substantially the same. The etching selection ratio of the etching solution with respect to the photo-resist layer PR and the first dielectric material layer 520 is greater than 1, and the etching selection ratio of the etching solution with respect to the photo-resist layer PR and the second dielectric material layer 530 is greater than 1. That is, the etching rates of etching the first dielectric material layer 520 and the second dielectric material layer 530 with the etching solution are greater than the etching rate of etching the photo-resist layer PR with the etching solution. However, the etching method is not limited to the wet etching process exemplified above, and other etching processes, such as a drying etching process, may also be used in response to the needs of the manufacturing process as long as the etching rates of the photo-resist layer PR, the first dielectric material layer 520, and the second dielectric material layer 530 satisfy the above relationship.

In an embodiment indicated in FIG. 5C, after the photo-resist layer PR is provided on the second dielectric material layer 530, the third dielectric material layer 570 can be optionally etched according to the photo-resist layer PR as a mask to form a third dielectric layer 170. As shown in FIG. 5D, in the embodiment, after the photo-resist layer PR is removed, the third dielectric layer 170 has a third through hole 170a connected to the first through hole 120a, and the first through hole 120a, the second through hole 130a, and the third through hole 170a form a recess 150. In an embodiment, the steps of etching the first dielectric material layer 520, etching the second dielectric material layer 530, and etching the third dielectric material layer 570 are completed at the same time. Furthermore, the steps of etching the first dielectric material layer 520, etching the second dielectric material layer 530, and etching the third dielectric material layer 570 are completed at the same time. The etching process is exemplified by a wet etching process. The first dielectric material layer 520, the second dielectric material layer 530, and the third dielectric material layer 570 are etched with the same etching solution. The recess 150 is formed by directly etching the first dielectric material layer 520, the second dielectric material layer 530, and the third dielectric material layer 570 at the same time without using any additional photo-resist layers for additional etching steps, such that the manufacturing procedures are simplified. However, if etching the first dielectric material layer 520, etching the second dielectric material layer 530, and etching the third dielectric material layer 570 are performed in different steps, then in the second etching step, the second photo-resist layer needs to be coated both inside and outside the opening formed in the first etching step, and the thickness of the second photo-resist layer coated inside the opening is greater than that coated outside the opening. When lithographic exposure process is performed, the amount of exposure energy is adjusted and higher exposure energy is required to be applied on the photo-resist layer coated inside the opening. Consequently, the conformity rate deteriorates. In this disclosure, when the recess 150 is formed by etching the first dielectric material layer 520, the second dielectric material layer 530, and the third dielectric material layer 570 at the same time in one etching step, the first dielectric material layer 520, the second dielectric material layer 530, and the third dielectric material layer 570 have flat surfaces and overall thickness is relatively thin (no opening needs to be filled), there is no need to adjust and provide higher exposure energy, and the manufacturing conformity rate is effectively increased.

In an embodiment, the first dielectric material layer 520, the second dielectric material layer 530 and the third dielectric material layer 570 may be formed of inorganic photo-resist materials substantially having the same etching rate to form the recess 150 in one etching step, wherein the side wall 150b of the recess 150 is substantially smooth and free of sectional differences. In an embodiment, the first dielectric material layer 520, the second dielectric material layer 530, and the third dielectric material layer 570 which have the same etching rate are etched at the same time to form the recess 150 in one etching step without using any additional photo-resist layers for additional etching steps. Also, a recess structure of at least three connecting openings having different widths resulted from at least three etching steps will not be formed. Thus, the manufacturing procedures are simplified, the extension in the lateral path of the array substrate structure resulted from the at least three connecting openings having different widths is reduced, the lateral path of the array substrate structure is effectively reduced, such that the product using such array substrate structure is downsized, and it is advantageous for such array substrate structure to be used in devices requiring high resolution.

In an embodiment, the etching step is performed by such as a wet etching process. The etching selection ratio of the etching solution with respect to the third dielectric material layer 570 and the first dielectric material layer 520 substantially is 1, and the etching selection ratio of the etching solution with respect to the third dielectric material layer 570 and the second dielectric material layer 530 is substantially 1. That is, the etching rates of the first dielectric material layer 520, the second dielectric material layer 530, and the third dielectric material layer 570 with respect to the etching solution are substantially the same. The etching selection ratio of the etching solution with respect to the photo-resist layer PR and the third dielectric material layer 570 is greater than 1. That is, the etching rate of etching the third dielectric material layer 570 with the etching solution is greater than the etching rate of etching the photo-resist layer PR with the etching solution. However, the etching method is not limited to the wet etching process exemplified above, and other etching processes, such as a drying etching process, may also be used in response to the needs of the manufacturing process as long as the etching rates of the photo-resist layer PR, the first dielectric material layer 520, the second dielectric material layer 530, and the third dielectric material layer 570 satisfy the above relationship.

Figure 5E:
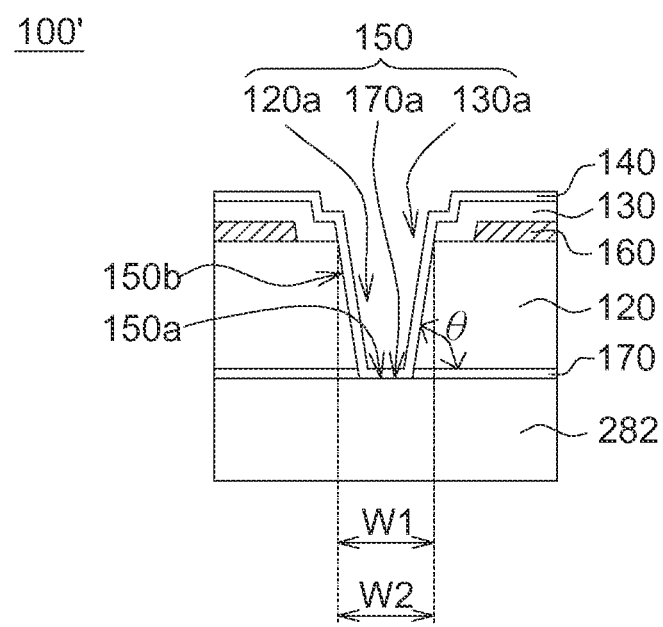

Referring to FIG. 5E, a second electrode layer 140 is formed on the second dielectric layer 130 and a bottom 150a and a side wall 150b of the recess 150. In an embodiment, the etching rates of the first dielectric material layer 520 and the second dielectric material layer 530 are substantially the same. In another embodiment, the etching rates of the first dielectric material layer 520, the second dielectric material layer 530, and the third dielectric material layer 570 are substantially the same. However, when the dielectric layers are formed by different materials, the etching rates may differ slightly and make the surface on the side wall 150b of the recess 150 uneven. Consequently, the second electrode layer 140 formed on the side wall 150b of the recess 150 becomes uneven and the second electrode layer 140 subsequently formed thereon may end up with an uneven surface. An angle θ, preferably less than or equal to 85° and greater than or equal to 50°, is contained between the side wall 150b and the bottom 150a of the recess 150. During the process of coating the second electrode layer 140 on the side wall 150b and the bottom 150a of the recess 150, the angle θ prevents the coated second electrode layer 140 from breaking and makes the surface of the coated second electrode layer 140 continuous and uniform. Thus, the array substrate structure 100' as shown in FIG. 5E is formed.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An array substrate structure, comprising:
   a first substrate;
   a plurality of thin film transistors disposed on the first substrate, wherein a top portion of each of the thin film transistors has a first electrode layer which is patterned;
   a first dielectric layer disposed on the first electrode layer and covering the thin film transistors, wherein the first dielectric layer has at least one first through hole corresponding to a part of the first electrode layer of each of the thin film transistors, and the first dielectric layer is formed of a photo-sensitive silicon-containinq material;
   a second dielectric layer formed of a photo-sensitive inorganic material and disposed on the first dielectric layer, wherein the second dielectric layer has a second through hole connected to the first through hole; and
   a second electrode layer disposed on the second dielectric layer, wherein the second electrode layer is electrically connected to the first electrode layer via the first through hole and the second through hole;
   wherein a top portion of the first through hole has a first width, a bottom portion of the second through hole has a second width, and the first width is substantially equal to the second width.

2. The array substrate structure according to claim 1, wherein the photo-sensitive silicon-containinq material is spin-on-glass (SOG).

3. The array substrate structure according to claim 1, further comprising:
   a third electrode layer disposed between the first dielectric layer and the second dielectric layer.

4. The array substrate structure according to claim 1, further comprising a third dielectric layer disposed between the first dielectric layer and the first substrate, wherein the third dielectric layer has a third through hole connected to the first through hole, and the first through hole, the second through hole, and the third through hole form a recess.

5. The array substrate structure according to claim 4, wherein a side wall of the recess and the first electrode layer form an angle, and the angle is smaller than or equal to 85°.

6. The array substrate structure according to claim 5, wherein the angle is further greater than or equal to 50°.

7. The array substrate structure according to claim 4, wherein the second electrode layer is further electrically connected to the first electrode layer via the third through hole.

8. A manufacturing method of an array substrate structure, comprising:
   providing a first substrate;
   forming a plurality of thin film transistors on the first substrate, wherein a top portion of each of the thin film transistors has a patterned first electrode layer;
   forming a first dielectric material layer deposed on the first electrode layer, wherein the first dielectric material layer is formed of a photo-sensitive silicon-containing material;
   forming a second dielectric material layer deposed on the first dielectric material layer, wherein the second dielectric material layer is formed of a photo-sensitive inorganic material;

providing a photo-resist layer deposed on the second dielectric material layer;

etching the first dielectric material layer and the second dielectric material layer according to the photo-resist layer as a mask to form a first dielectric layer and a second dielectric layer, wherein the first dielectric layer has a first through hole, and the second dielectric layer has a second through hole at a location corresponding to the fist through hole and connected to the first through hole; and forming a second electrode layer deposed on the second dielectric layer, wherein the second electrode layer is electrically connected to the first electrode layer via the first through hole and the second through hole.

9. The manufacturing method of the array substrate structure according to claim 8, wherein a top portion of the first through hole has a first width, and a bottom portion of the second through hole has a second width substantially equal to the first width.

10. The manufacturing method of the array substrate structure according to claim 8, wherein in the step of etching the first dielectric material layer and the second dielectric material layer, the first dielectric material layer and the second dielectric material layer are etched with an etching solution.

11. The manufacturing method of the array substrate structure according to claim 10, wherein an etching selection ratio of the etching solution with respect to the first dielectric material layer and the second dielectric material layer is substantially 1.

12. The manufacturing method of the array substrate structure according to claim 8, wherein after forming the first dielectric material layer on the first electrode layer, the method further comprises:

forming a third electrode layer on the first dielectric layer; and forming the second dielectric material layer on the third electrode layer.

13. The manufacturing method of the array substrate structure according to claim 8, wherein after the patterned first electrode layer is formed, the method further comprises:

forming a third dielectric material layer on the first electrode layer; and forming the first dielectric material layer on the third dielectric material layer;

wherein after providing the photo-resist layer on the second dielectric material layer, the method further comprises:

etching the third dielectric material layer according to the photo-resist layer as a mask to form a third dielectric layer, wherein the third dielectric layer has a third through hole connected to the first through hole, and the first through hole, the second through hole, and the third through hole form the recess.

14. The manufacturing method of the array substrate structure according to claim 13, wherein in the step of etching the third dielectric material layer, the third dielectric material layer is etched with an etching solution.

15. The manufacturing method of the array substrate structure according to claim 14, wherein an etching selection ratio of the etching solution with respect to the third dielectric material layer and the first dielectric material layer is substantially 1, and an etching selection ratio of the etching solution with respect to the third dielectric material layer and the second dielectric material layer is substantially 1.

16. The manufacturing method of the array substrate structure according to claim 8, wherein the step of etching the first dielectric material layer and the step of etching the second dielectric material layer are completed at the same time.

17. The manufacturing method of the array substrate structure according to claim 8, further comprising removing the photo-resist layer.

18. A display panel, comprising:

an array substrate structure according to claim 1;

a second substrate having a light filtering layer disposed opposite to the first substrate; and a liquid crystal layer disposed between the first substrate and the second substrate.

* * * * *